(12) United States Patent
Zhong et al.

(10) Patent No.: US 6,898,757 B1
(45) Date of Patent: May 24, 2005

(54) DECODING MULTI-BLOCK PRODUCT CODE

(75) Inventors: Yan Zhong, San Jose, CA (US); Lin Yang, Fremont, CA (US)

(73) Assignee: Legend Silicon Corporation, Fremont, CA (US)

( * ) Notice: Subject to any disclaimer, the term of this patent is extended or adjusted under 35 U.S.C. 154(b) by 484 days.

(21) Appl. No.: 10/117,388

(22) Filed: Apr. 4, 2002

(51) Int. Cl.[7] .................. H03M 13/25; H03M 13/03
(52) U.S. Cl. ............................ 714/794; 714/810
(58) Field of Search ................... 714/794, 810

(56) References Cited

U.S. PATENT DOCUMENTS

| | | | | |
|---|---|---|---|---|
| 5,233,479 | A | * | 8/1993 | Nakatsu et al. ............... 360/29 |
| 5,909,454 | A | * | 6/1999 | Schmidt ............................. 1/1 |
| 6,115,435 | A | * | 9/2000 | Harada et al. ............... 714/794 |
| 6,591,395 | B1 | * | 7/2003 | Tsai ............................. 714/794 |
| 6,745,365 | B2 | * | 6/2004 | Kokuryo et al. ............ 714/794 |
| 2002/0122510 | A1 | * | 9/2002 | Yakhnich et al. ........... 714/794 |
| 2003/0026346 | A1 | * | 2/2003 | Matsumoto et al. ........ 714/786 |
| 2003/0053435 | A1 | * | 3/2003 | Sindhushayana et al. ... 370/342 |
| 2003/0072395 | A1 | * | 4/2003 | Jia et al. ..................... 375/341 |

OTHER PUBLICATIONS

Schreckenbach, F., Gortz, N.; Hagenauer, J.; Bauch, G.; Optimization of symbol mappings for bit–interleaved coded Modulation with iterative decoding; Communications Letters, IEEE, vol.: 7, Issue: 12, Dec. 2003; pp.: 593–595.*

Pottie, Gregory J.; Eyuboğlu; Combined Coding and Precoding for PAM and QAM HDSL Systems; Selected Areas in Communications, IEEE Journal on; vol. 9, No. 6, Aug. 1991, pp. 861–870.*

* cited by examiner

Primary Examiner—R. Stephen Dildine
(74) Attorney, Agent, or Firm—Patent Law Group LLP; Carmen C. Cook

(57) ABSTRACT

A method for efficient decoding of block product code format signals, using a $(2^{2p})$QAM signal constellation for mapping of a received signal, with p=2, 3, 4, 5, . . . A received signal value $r_x$, corresponding to an x=I or x=Q coordinate, is converted to a p-tuple $(B_{(p-1)x}, \ldots, B_{0x})$ corresponding to a "closest" I-coordinate or Q-coordinate numerical value, and a p-stage algorithm is applied to the signal values $r_x$ and to the p-tuples $(B_{(p-1)x}, \ldots, B_{0x})$ to determine a p-tuple $(r_{(p-1)x}, \ldots, r_{0x})$ representing a decoded p-bit value for the received signal value $r_x$. Depending upon a communication channel parameter Eb/N0 and the bit error ratio BER associated with each of the p bits, the received signal values $r_x$ may be suitable for some or all communications activities (e.g., HDTV, SDTV, mobile comm).

15 Claims, 4 Drawing Sheets

DECODING MULTI-BLOCK PRODUCT CODE

FIELD OF THE INVENTION

This invention relates to efficient encoding, mapping, demodulation and decoding of signals expressed in a multi-level block product code format.

BACKGROUND OF THE INVENTION

A product code is a multi-dimensional array of (n,k) linear block code that exploits a simple and relatively efficient method to construct more powerful codes using linear block code structures. FIG. 1 illustrates construction of a two-dimensional block product code, using a k1×k2 array of data to be encoded. In the encoding, each row of k2 data values is augmented to include n2-k2 parity check bits for the data in that row; and each column of k1 data values is augmented to include n1-k1 parity check bits for the data in that column. The (n1k1)×(n2-k2) region at the lower right of this block contains parity check bits for each of the n2-k2 columns above and for each of the n1−k1 rows to the left. Where, for example, a BCH code is used in a 64QAM configuration, k1=k2=57 and n1=n2=63. Because $57=2^6-6-1$, the 7 conventional parity check bits can be replaced by 7 Hamming error check bits using a Hamming single error correction formulation, as discussed in S. B. Wicker, *Error Control Systems*, Prentice Hall, Englewood Cliffs N.J., 1995, pp. 8–11, 90–94.

In any digital representation of a signal value, the most important bit is the MSB (most significant bit), followed in turn by other bits (MSB-1, MSB-2, . . . , LSB) in the representation sequence. In a conventional transmission of this digital representation, all bits are treated equally in signal coding and decoding for such transmission. This approach is often inefficient, because the bits are not equally affected by noise and other perturbations in the transmission channel and are not equally important. This is especially true where a QAM configuration is used and the higher order bits (MSB, MSB-1, etc.) are more likely to be correct.

What is needed is an efficient method for encoding and mapping a digital sequence into a sequence of signal values, and decoding the received signal values into a corresponding true digital sequence before encoding at the transmitter side, using a $(2^{2p})$QAM configuration (p=2, 3, 4, etc.) for the I and Q components. This method should allow different bits in a digital representation to be protected and transmitted differently, if desired, to take account of the differing likelihoods that each bit will become corrupted by noise and other perturbations in the transmission channel.

SUMMARY OF THE INVENTION

These needs are met by the invention, which provides an optimal procedure for transmission and decoding of different bits in a digital representation of a signal value. For example, where a 64QAM (I,Q) configuration is used, the I and Q coordinates are assigned eight monotonically increasing values, −v1, −v2, −v3, −v4, v4, v3, v2 and v1, and a three-step decoding algorithm is implemented to determine a triple of values, $(r_{b2}, r_{b1}, r_{b0})$ or (B2,B1,B0), representing the decoded received signal. For other QAM configurations, other optimal value assignments are used. A transmission channel figure of merit, such as Eb/N0, is estimated to determine a (different) bit error rate associated with each of the transmitted bits.

DESCRIPTION OF BEST MODES OF THE INVENTION

Figure 1:
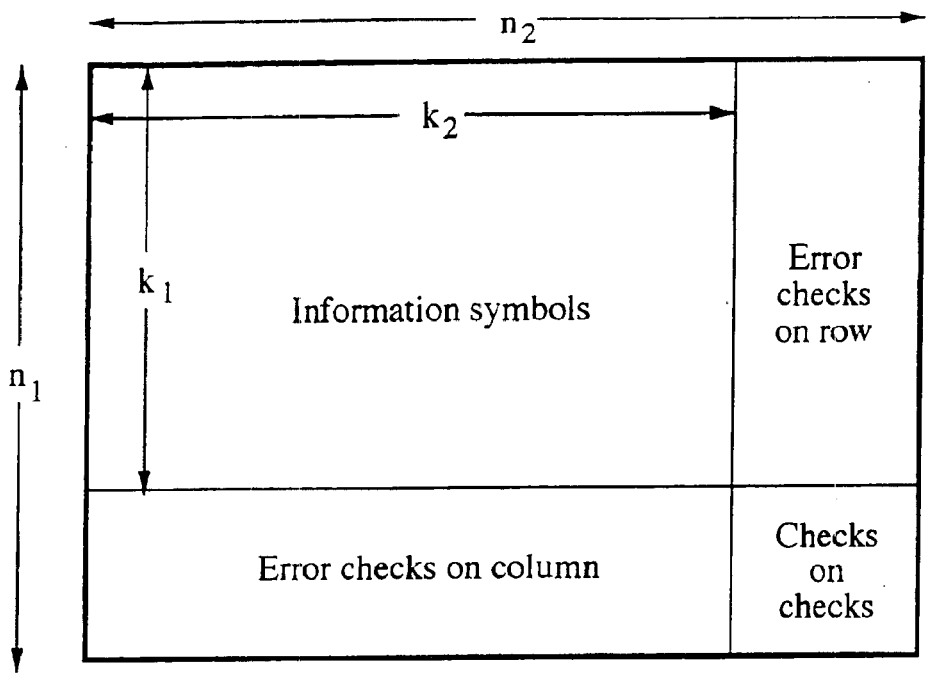
FIG. 1 illustrates a block product code in two dimensions.
Figure 2:
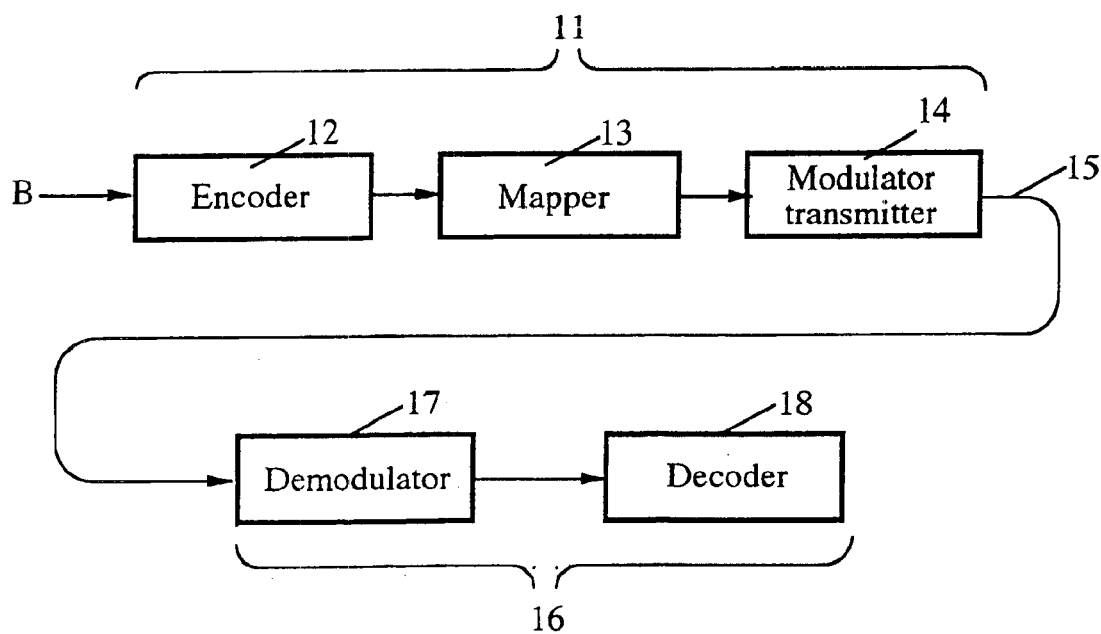
FIG. 2 illustrates a signal transmission environment according to the invention.

With reference to FIG. 2, a digital bit sequence B is to be transmitted using a QAM or similar signal representation scheme, from a transmission module 11, through a transmission channel 15, to a receiving module 16. The sequence is processed by an encoder 12, a mapper 13 and a modulator 14 in the transmitter 11, producing an analog signal that is transmitted over the channel 15. The transmitted signal is received at the receiver 16, which includes an analog-to-digital converter or demodulator (ADC) 17, whose output signal W' is a sequence of digital values corresponding to the output signal of the mapper 13; if no noise is present, W'=W. The sequence W' is decoded by a multi-level BPC decoder 18 to recover the B=3·k bits received by the encoder 12.

It is assumed that the bit B(k−1) is less important than, or no more important than, the bit Bk for k=1, 2, . . . , M. The sequence W is mapped by decomposition into two or more consecutive and mutually exclusive segments or sub-sequences of bits, SB1=(BM, . . . , Bk) and SB2=(B(k−1), . . . , B0), or into M+1 single-bit segments, and each segment is provided with a different level of protection before transmission occurs. The sequence is received and decoded by a procedure that takes account of the differing consequences of, and likelihood of, a sequence being corrupted by the transmission process.

Consider a digital word W having six bits (M=5) that is represented with 3 I bits and 3 Q bits in an (I,Q) format. In the most general approach, each I bit and each Q bit is provided with a different level of protection as part of the transmission process. If desired, a segment with two or more consecutive bits can be provided with the same protection. The appropriate QAM representation here uses $2^{(3+3)}(=64$ (I,Q) coordinates in four quadrants of the ((I,Q) plane.

Figure 3:
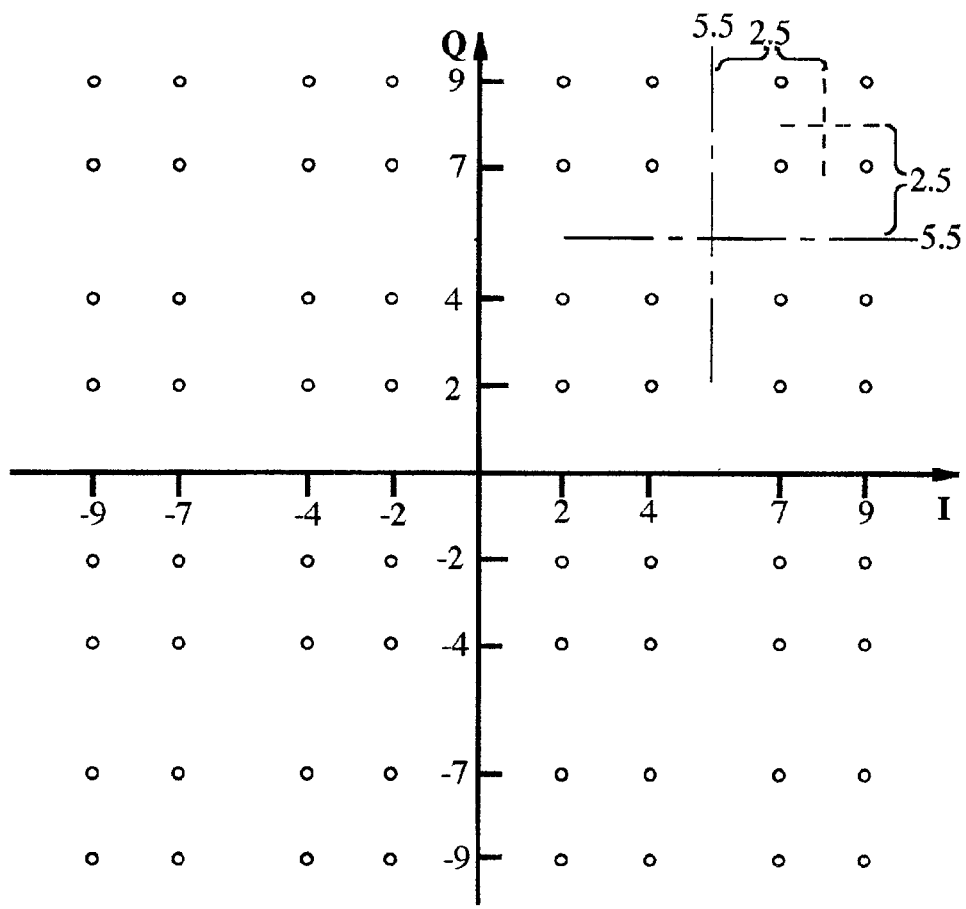
FIGS. 3, 5 and 6 illustrate signal constellations for 64QAM and two kinds of 16QAM, according to the invention.

In a hierarchical 64QAM modulation, illustrated in FIG. 3, 64 (I,Q) signal coordinate pairs are arranged into 4 groups of 4×4 blocks, one in each of the four quadrants in the plane. Each signal or signal value received is assigned to the "closest" (according to the metric adopted) of the 64 indicated locations in the plane, depending upon the amplitude and phase associated with that signal. Several QAM configurations are discussed and illustrated in W. Tomasi, *Electronic Communication Systems*, Prentice Hall, Englewood Cliffs, NJ, 1988, pp. 518–528. One problem in use of a QAM configuration is to indicate, using as few bits as possible, which signal location is presently referred to. In the invention, a 64QAM configuration uses six bits to refer to the (I,Q) location for the present signal, and these bits are specified as follows.

Consider the two three-bit specifications, (B2,B1,B0)=(I2,I1,I0) and (B2,B1,B0)=(Q2,Q1,Q0), referring to the in-phase coordinate and the quadrature coordinate, respectively, with each bit independently having the usual values, 0 and 1. In a preferred embodiment, each bit B2, B1 and B0 is transmitted as part of a different 64×64 block. Table 1 sets forth the assignment of the bit value combinations for the I and Q coordinates, and FIG. 3 indicates the coordinate positions in the plane corresponding to each of these 64 combinations.

TABLE 1

I and Q Location Assignments in 64QAM.

| (I2, I1, I0) | I Coor. Value | (Q2, Q1, Q0) | Q Coor. Value |
|---|---|---|---|
| (0, 0, 0) | −9 | (0, 0, 0) | −9 |
| (0, 0, 1) | −7 | (0, 0, 1) | −7 |
| (0, 1, 0) | −4 | (0, 1, 0) | −4 |
| (0, 1, 1) | −2 | (0, 1, 1) | −2 |
| (1, 0, 0) | 2 | (1, 0, 0) | 2 |
| (1, 0, 1) | 4 | (1, 0, 1) | 4 |
| (1, 1, 0) | 7 | (1, 1, 0) | 7 |
| (1, 1, 1) | 9 | (1, 1, 1) | 9 |

For example, the pair of triples {(I2,I1,I0), (Q2,Q1,Q0)} = {(0,1,0), (1,1,0)} has the (I,Q) location coordinates (−4, 7), and the pair of triples {(I2,I1,I0), (Q2,Q1,Q0)} = {(1,0,0), (0,0,1)} has the (I,Q) location coordinates (2,−7), as indicated in FIG. 3. In a 64QAM configuration, a signal is assigned the (I,Q) coordinates of the location closest to the <measured or observed signal amplitude and phase values.

For example, consider a signal for which the measured or observed (I,Q) values are $(r_I, r_Q) = (-3.4, +5.6)$. With reference to the I and Q coordinate values ±vk chosen in Table 1, namely $(-v1, -v2, -v3, -v4, v4, v3, v2, v1) = (-9, -7, -4, -2, 2, 4, 7, 9)$, the "closest" of these coordinate values may be computed as follows. When $r_x \geq 0$ (x=I,Q), define $$r\char`\^_x = vk \text{ for which } |r_x - vk'| = \text{minimum value } (k'=1, 2, 3, 4). \quad (1)$$

When $r_x < 0$, define $$r\char`\^_x = -vk \text{ for which } |r_x + vk'| = \text{minimum value } (k'=1, 2, 3, 4). \quad (2)$$

Now identify the triple $(B_{x2}, B_{x1}, B_{x0})$ from Table 1 that corresponds to $r\char`\^_x$ for x=I and for x=Q. For the example discussed here, $(r\char`\^_I, r\char`\^_Q) = (-4, 7)$ and (I2,I1,I0)=(0,1,0) and (Q2,Q1,Q0)=(1,1,0). A different, Viterbi-type process can also be used to decode the values (I2,I1,I0) and (Q2,Q1,Q0) associated with the received signal values $r_I$ and $r_Q$.

The decision process set forth above, as well as many Viterbi-type processes, for determining the triple (I2,I1,I0) and/or (Q2,Q1,Q0) is a soft input-hard output (SIHO) process that is simple to apply but may not provide an optimal solution for determining the correct digital values of the transmitted triples. In a preferred embodiment, the invention uses a soft input-soft output (SISO) decision process in that it provides an intermediate sequence of probability values (associated with a selected probability measure) that a given triple (B2,B1,B0) is the correct or optimal choice, as well as iteratively decoding these intermediate probabilities. One SISO decision process, referred to as the MAP (maximum a posteriori probability) process or the BCJR process, is discussed in detail by C. Heegard and S. B. Wicker in *Turbo Coding*, Kluwer Academic Publishers, Boston, 1999, pp. 70–71 and 121–140; the content of this discussion is incorporated by reference herein.

Figure 4:
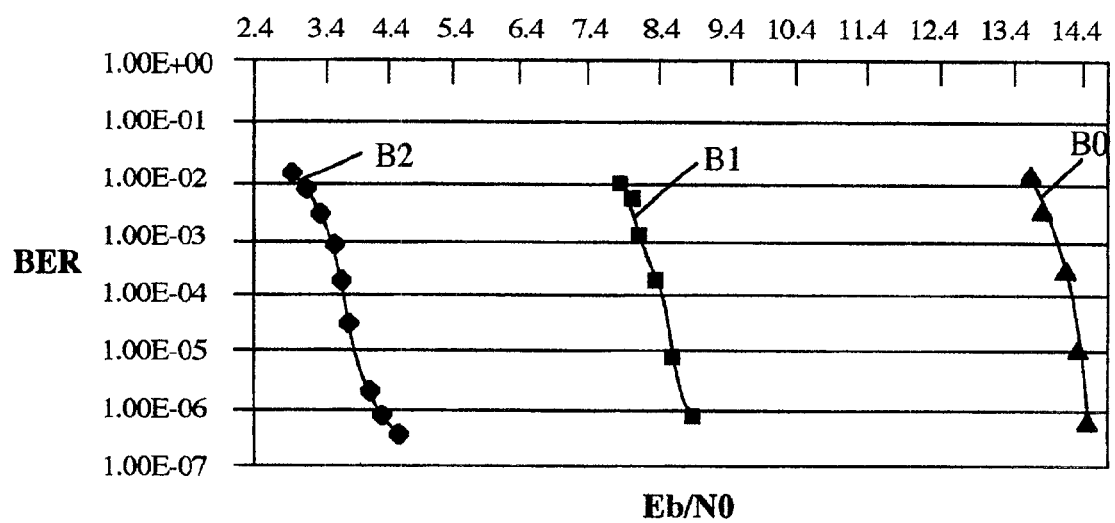
FIGS. 4, 7 and 8 graphically illustrate relationships between expected bit error rates (BER) and a signal-noise quality parameter Eb/N0 as used in the invention for 64QAM and two different 16QAM configurations.

The (I,Q) coordinate values assigned according to Table 1 can be changed to decode to an integer set other than {−9, −7, 4, −2, 2, 4, 7, 9}, but it is preferred that the eight numbers used be a monotonic and distinct sequence, with a positive increment between any two consecutive values in the sequence so that a bit error rate performance curve (e.g., as shown in FIG. 4) be approximately uniformly distributed.

With reference to the specification in terms of a triple (I2,I1,I0) or (Q2,Q1,Q0), the corresponding symbol is a combination of three blocks (or six blocks) in an ordered sequence of 57 bits +6 bits +1 bit. The 57 upper bits are message or data bits, the next 6 bits are parity check bits, and the LSB (one bit) is a modulo-2 sum of the preceding 63 bits.

Assume that an analog signal is received as indicated in FIG. 2 and processed by the demodulator 17 to provide a digital sequence (I,Q) to be decoded by the decoder 18. Let (B2,B1,B0) represent the received I channel component, or the Q channel component, of the signal after decoding in a 64QAM format. For the mapping set forth in Table 1, the set of positive index values (v1,v2,v3,v4)=(9,7,4,2) has an average value of a1=(9+7+4+2)/4=5.5. The average value of a first remainder (after subtraction of the first average value of 5.5) is a2=(7+9)12−5.5=2.5. A second remainder is a2=(9−7)/2=1. The average value and first remainder value for each of the I and Q coordinates are indicated in FIG. 3. The received index values, ±v1, ±v2, ±v3 and ±v4, will include noise associated with the transmission channel.

Using a selected metric process such as the one discussed in connection with Eqs. (1) and (2), or an SISO process, a triple (B2,B1,B0) of digital values is determined whose corresponding numerical value from Table I is "closest" to the received signal value. In an SISO process the values Bk (k=2,1,0) are decoded individually, not as a group.

The received signal value r=(j) of the jth QAM signal is divided by the first average, a1=5.5, as a first stage in the decoding process $$r_{b2} = r/a1 = r/5.5, \quad (3)$$

where $r_{b2}(j)$ is not usually an integer and represents a symbol value, corresponding to an MSB coordinate. Using the value $r_{b2}$ as an input for first stage decoding, a digital value B2 is determined. In a second stage of decoding, a first remainder:

$$r_{b1} = \{r/5.5 - (2 \cdot B2 - 1)\} \cdot (a1/a2) = \{r_{b2} - (2 \cdot B2 - 1)\} \cdot (5.5/2.5) \quad (4)$$

is computed, and a digital value B1 is determined after decoding of the input value $r_{b1}$. In a third stage of decoding, a second remainder $$r_{b0} = \{r/a1 - (2 \cdot B2 - 1)\} \cdot a1 - (2 \cdot B1 - 1) \cdot (a2/a3) = \{r_{b1} - (2 \cdot B1 - 1)\} \cdot 2.5. \quad (5)$$

is computed. The decoder thus receives the signal value r=r(j), determines a first ordered sequence of digital values $\{r_{b2}(j), r_{b1}(j), r_{b0}(j)\}$, and determines a second ordered sequence (B2,B1,B0), individually or collectively, representing a decoding of the original received signal, r=r(j), for the selected 64QAM format. For example, if the received signal r(j) has a value of 6.5, the decoding sequence for this received signal becomes $\{r_{b2}(j), r_{b1}(j), r_{b0}(j)\} = \{1.1818, 0.4, -1.5\}$.

FIG. 4 graphically illustrates the relationships between bit error rates (which range from $10^{-7}$ to $10^{-2}$) associated with decoding of each of the three bits B2, B1 and B0 for values of a channel figure of merit, a signal-noise parameter Eb/N0, using the decoding scheme of the invention for a 64QAM format. With this approach, the increment Δ(Eb/N0) from bit B2 to bit B1, and from bit B1 to bit B0, is approximately 6 dB for each of these increments. This is a desirable situation. If Δ(Eb/N0; B2;B1) and Δ(Eb/N0;B1;B0) have substantially different numerical values, the smaller of these two increments would be dominant for purposes of BER control, which is not an optimal situation.

If the parameter value satisfies Eb/N0=14.5 dB, which would be typical for a reasonably quiet and stationary environment not subjected to strong perturbations (e.g., home receipt of a television signal), all three bits (B2,B1,B0) can be recovered without error. In this ideal environment, an HDTV signal can be transmitted, received and displayed.

If the parameter value satisfies 7.5 dB≦Eb/N0<14.5 dB, the bits B2 and B1 can be recovered without error, but the bit value B0 will have varying errors. In this environment, for example, a standard television signal SDTV may be transmitted, received and displayed.

If the parameter value satisfies 3.5 dB≦Eb/N0<7.5 dB, corresponding to a mobile transmission environment, only the bit B2 can be recovered without error, and the bits B1 and B0 will have varying errors. In this environment, for example, a black and white television signal or a paging signal, using a single signal value (B2), can be transmitted, received and displayed. If the parameter value satisfies Eb/N0<3.5 dB, no signal bit is free from expected error.

Figure 5:
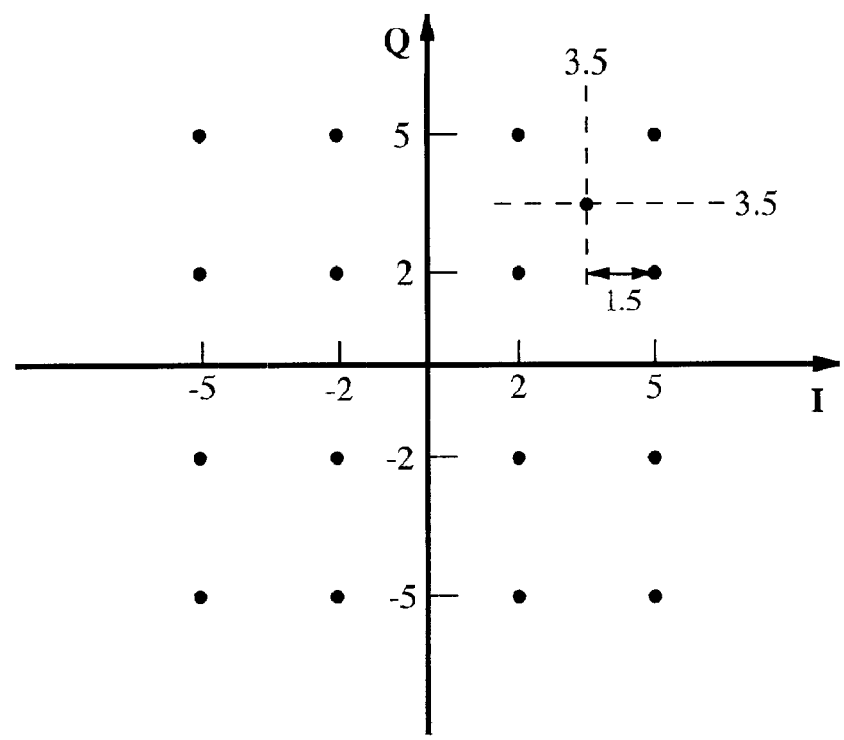

A four-bit transmission system will use $2^4=16$ (I,Q) values. FIG. 5 illustrates a 16QAM configuration, analogous to the 64QAM configuration shown in FIG. 3, arranged into 4 2×2 blocks, one in each of the four quadrants. Here, the I and Q coordinate values assigned to the 16 locations are ±2 and ±5. Table 2 sets forth the I and Q location assignments for this configuration of 16QAM, corresponding to FIG. 5.

TABLE 2

I and Q Location Assignments in 16QAM.

| (I1, I0) | I Coor. Value | (Q1, Q0) | Q Coor. Value |
|---|---|---|---|
| (0, 0) | −5 | (0, 0) | −5 |
| (0, 1) | −2 | (0, 1) | −2 |
| (1, 0) | 2 | (1, 0) | 2 |
| (1, 1) | 5 | (1, 1) | 5 |

Within a quadrant, the horizontal or vertical nearest neighbor separation distance of any two locations is 3 units (=5−2). Between two adjacent quadrants the nearest neighbor separation distance is 4 units (=2−(−2)). The average I values or average Q values and remainder values for the assigned locations in the first quadrant are a1=(5+2)/2=3.5 and a2=(5−2)/2=1.5.

Decoding for this 16QAM configuration proceeds as follows. If the jth signal value received is r=r(j), the pair (B1,B0) is decoded in two steps:

$$r_{b1} = r/a1 = r/3.5, \quad (6)$$

$$r_{b0} = a1 \cdot \{r_{b1} - (2 \cdot B1 - 1)\}/(a2) \quad (7)$$
$$= 3.5 \cdot \{r_{b1} - (2 \cdot B1 - 1)\}/(1.5).$$

For example, if the received signal r(j) has a value of 2.75, corresponding to (B1,B0)=(1,0), the decoding sequence for this received signal becomes $\{r_{b1}(j), r_{b0}(j)\} = \{0.7858, -0.5\}$.

The relationships between bit error rates associated with each of the two bits B1 and B0 and the 16QAM format, for the I and Q coordinates choices (±2,±5), are similar to those shown in FIG. 4 for the QAM format.

Figure 6:
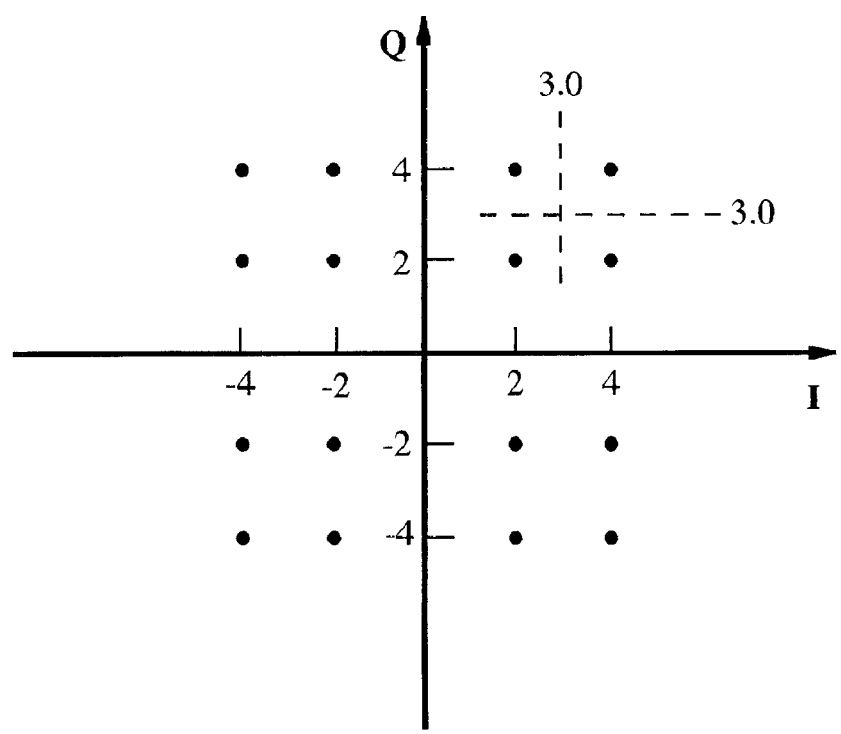

FIG. 6 illustrates a different 16QAM configuration, in a different set of I and Q coordinate values are assigned to the 16 locations: ±4 and ±2. Table 3 sets forth the I and Q location assignments for the 16QAM configuration of FIG. 6.

TABLE 3

I and Q Location Assignments in 16QAM.

| (I1, I0) | I Coor. Value | (Q1, Q0) | Q Coor. Value |
|---|---|---|---|
| (0, 0) | −4 | (0, 0) | −4 |
| (0, 1) | −2 | (0, 1) | −2 |
| (1, 0) | 2 | (1, 0) | 2 |
| (1, 1) | 4 | (1, 1) | 4 |

Within a quadrant, the horizontal or vertical nearest neighbor separation distance of any two locations is 2 units (=4−2). Between two adjacent quadrants the nearest neighbor separation distance is 4 units (=2−(−2)). The average and remainder values for the assigned locations in the first quadrant are a1=(4+2)/2=3.0 and a2=(4−2)/2=1.0.

Decoding for this 16QAM configuration proceeds as follows. If the jth signal value received is r=r(j), the pair (B1,B0) is decoded in two steps:

$$r_{b1} = r/a1 = r/3.0, \quad (8)$$

$$r_{b0} = a1 \cdot \{r_{b1} - (2 \cdot B1 - 1)\}/(a2) \quad (9)$$
$$= 3.0 \cdot \{r_{b1} - (2 \cdot B1 - 1)\}/(1.0).$$

Figure 7:
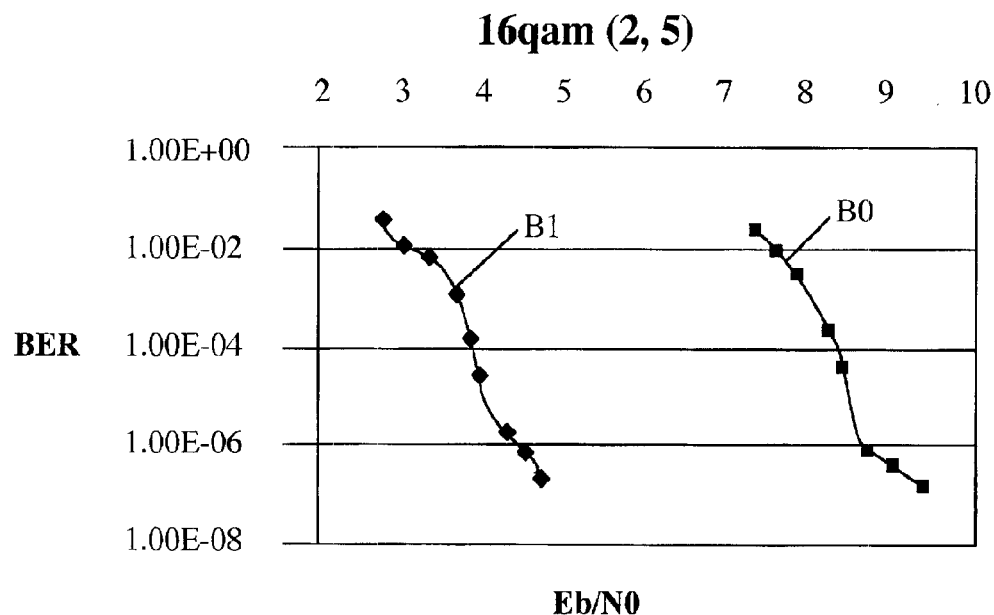
Figure 8:
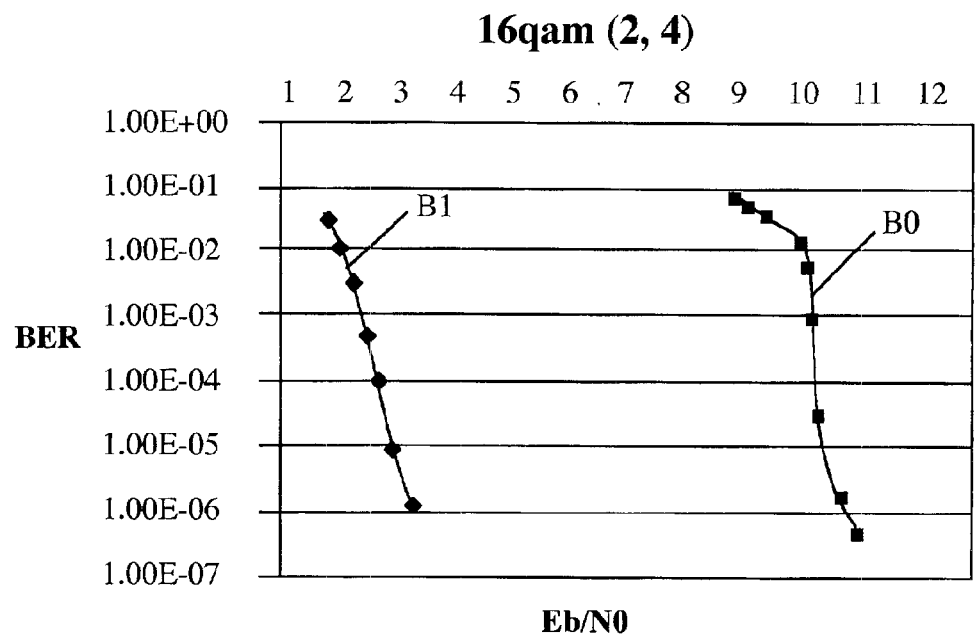

FIGS. 7 and 8 graphically illustrate the relationships between bit error rates (which range from $10^{-7}$ to $10^{-2}$) associated with decoding of each of the two bits, B1 and B0, for values of a channel figure of merit, a signal-noise parameter Eb/N0, using the decoding scheme of the invention for the two 16QAM configurations discussed herein. Although the two configurations produce similar BER values for corresponding Eb/N0 ratios, the bit B0 for the 16QAM (2,5) configuration has significantly lower BER values, and the (2,5) mapping may be preferred over the (2,4) mapping for that reason. However, the (2,5) mapping uses more energy than the (2,4) mapping, and the required range of the Eb/N0 ratio for the bit B1 is higher for the (2,5) mapping than for the (2,4) mapping so that the (2,4) mapping may be preferred over the (2,5) mapping.

More generally, assume that a $(2^{2p})$QAM configuration is to be used to encode, transmit and decode a bit sequence (B(p−1),B(p−2), ..., B0), representing a signal value r, where p=2, 3, 4, ... is a selected positive integer. Assume that the p values of the I coordinates and the p values of the Q coordinates in a first quadrant are selected to be a monotonically strictly decreasing sequence v1, v2, ..., v($2^p$) of positive values. The signal value r=r(j) is received and processed and recovered as a p-tuple $(r_{b,p-1}, r_{b,p-2}, \ldots, r_{b,0})$, defined by $$r_{b,p-1} = r/a(1), \quad (10)$$

$$r_{b,p-k-1} = \{r_{b,p-k} - (2 \cdot B(p-k) - 1) \cdot (a(k))\}/(a(k+1)) \ (k=1, \ldots, p-2), \quad (11)$$

$$r_{b,0} = a(p-1)\{r_{b,1} - (2 \cdot B1 - 1)\}/a(p) \quad (12)$$

$$a(k) = \{v1 + \ldots + v(2^{p-k})\}/2^{p-k} - a(k-1), \quad (13)$$

$$a(0) = 0, \quad (14)$$

$$a(p) = (v1 - v2)/2, \quad (15)$$

where the coordinate B(p−k) is determined or decoded using an SIHO or SISO process or a selected metric process from the values $r_{b,p-k}$, as a modified version of the received signal r=r(j), in a p-step decoding procedure. In particular, this prescription extends the invention to use of a 256QAM configuration, with p=4, and to use of 1024QAM configuration, with p=5.

What is claimed is:

1. A method for efficient decoding of block product code format signals, the method comprising:

providing signal values $r_{I,i}$ and $r_{Q,i}$ (i=1, ..., J; J≧1) representing J signal values expressed in a 64QAM configuration in which each of the I coordinate and the Q coordinate is associated with one of eight selected non-zero, monotonically increasing values that are approximately equal to −v1, −v2, −v3, −v4, v4, v3, v2 and v1;

providing average values a1=(v1+v2+v3+v4)/4, a2=(v1+v2)/2−a1 and a3=v1−a1−a2 for the I and Q coordinate values in a first quadrant in the (I,Q) array;

computing first and second triples of values defined by $$r_{xi,2} = r_{x,i}/a1 (x=I, Q),$$

$$r_{xi,0} = \{r_{xi,1} - (2 \cdot B_{1x,i} - 1)\} \cdot (a2/a3),$$

and determining a triple of values $(B_{2x,i}, B_{1x,i}, B_{0x,i})$, each value equal to 0 or 1, representing the signal value $r_{x,i}$ in the 64QAM configuration, according to a selected decoding process; and interpreting the triple $(B_{2x,i}, B_{1x,i}, B_{0x,i})$ as a decoded sequence representing the numerical value $r_{x,i}$.

2. The method of claim 1, further comprising choosing said four selected values to be v1=9, v2=7, v3=4 and v4=2.

3. The method of claim 1, further comprising determining said values $B_{nx,i}$ (n=0, 1, 2) according to a procedure comprising:

when $r_{x,i} \geq 0$, computing $r\hat{}_{x,i} = vk$ for which $|r_{x,i}-vk'|$ = minimum value (k'=1, 2, 3, 4);

when $r_{x,i} < 0$, computing $r\hat{}_{x,i} = -vk$ for which $|r_{x,i}+vk'|$ = minimum value (k'=1, 2, 3, 4); and expressing $r\hat{}_{x,i}$ as a triple $(B_{2x,i}, B_{1x,i}, B_{0x,i})$ representing said I coordinate (x=I) or said Q coordinate (x=Q) in said 64QAM configuration.

4. The method of claim 1, further comprising determining said values $B_{nx,i}$ (n=0, 1, 2) according to a maximum a posteriori probability procedure, using said signal values $r_{x,i}$.

5. The method of claim 1, wherein said signal values $r_{I,i}$ and $r_{Q,i}$ are provided by a procedure comprising:

expressing each of a sequence of signal values $r'_i$ (I=1, ..., J) as a combination of a first triple $(B'_{2I,i}, B'_{1I,i}, B'_{0I,i})$ and a second triple $(B'_{2Q,i}, B'_{1Q,i}, B'_{0Q,i})$ of values;

embedding each value of the first triple and of the second triple for the sequence of signal values $r'_i$ in a multi-level block product code format;

modulating first and second multi-level block product codes containing the sequences of triples $(B'_{2I,i}, B'_{1I,i}, B'_{0I,i})$ and $(B'_{2Q,i}, B'_{1Q,i}, B'_{0Q,i})$, respectively, as modulated sequences, and transmitting the modulated sequences; and receiving the modulated sequences as said signal values $r_{I,i}$ and $r_{Q,i}$.

6. A method for efficient decoding of block product code format signals, the method comprising:

providing signal values $r_{I,i}$ and $r_{Q,i}$ (i=1, ..., J; J≧1) representing J signal values expressed in a 16QAM configuration in which each of the I coordinate and the Q coordinate is associated with one of four selected non-zero, monotonically increasing values that are approximately equal to −v1, −v2, v2 and v1;

providing average values a1=(v1+v2)/2 and a2=v1−a1 for the I and Q coordinate values in a first quadrant in the (I,Q) array;

computing first and second pairs of values defined by $$r_{xi,1} = r_{x,i}/a1 (x=I, Q),$$

and determining a pair of values $(B_{1x,i}, B_{0x,i})$ each value equal to 0 or 1, representing the signal value $r_{x,i}$ in the 16QAM configuration, according to a selected decoding process; and interpreting the pair $(B_{1x,i}, B_{0x,i})$ as a decoded sequence representing the numerical value $r_{x,i}$.

7. The method of claim 6, further comprising choosing said two selected values to be v1=5, v2=2.

8. The method of claim 6, further comprising choosing said two selected values to be v1=4, v2=2.

9. The method of claim 6, further comprising determining said values $B_{nx,i}$ (n=0, 1) according to a procedure comprising:

when $r_{x,i} \geq 0$, computing $r\hat{}_{x,i} = vk$ for which $|r_{x,i}-vk'|$ = minimum value (k'=1, 2);

when $r_{x,i} < 0$, computing $r\hat{}_{x,i} = -vk$ for which $|r_{x,i}+vk'|$ = minimum value (k'=1, 2); and expressing $r\hat{}_{x,i}$ as a pair $(B_{1x,i}, B_{0x,i})$ representing said I coordinate (x=I) or said Q coordinate (x=Q) in said 16QAM configuration.

10. The method of claim 6, further comprising determining said values $B_{nx,i}$ (n=0, 1) according to a maximum a posteriori probability procedure, using said signal values $r_{x,i}$.

11. The method of claim 6, wherein said signal values $r_{I,i}$ and $r_{Q,i}$ are provided by a procedure comprising:

expressing each of a sequence of signal values $r'_i$ (I=1, ..., J) as a combination of a first pair $(B'_{1I,i}, B'_{0I,i})$ and a second pair $(B'_{1Q,i}, B'_{0Q,i})$ of values;

embedding each value of the first pair and of the second pair for the sequence of signal values $r'_i$ in a multi-level block product code format;

modulating first and second multi-level block product codes containing the sequences of pairs, $(B'_{1I,i}, B'_{0I,i})$ and $(B'_{1Q,i}, B'_{0Q,i})$, respectively, as modulated sequences, and transmitting the modulated sequences; and receiving the modulated sequences as said signal values $r_{I,i}$ and $r_{Q,i}$.

12. A method for efficient decoding of block product code format signals, the method comprising:

providing signal values $r_{I,i}$ and $r_{Q,i}$ (i=1, ..., J; J≧1) representing J signal values expressed in a $(2^{2p})$QAM configuration in which each of the I coordinate and the Q coordinate is associated with one of $2^{2p-2}$ selected non-zero, monotonically increasing values that are approximately equal to −v1, −v2, ..., −v($2^{p-k}$), v($2^{p-1}$), ..., v2 and v1;

providing average values ak={v1+ ... +v($2^{p-k}$)}/($2^{p-k}$) (k=1, ..., p−1) and a(p)=v1−a1−a(p−1) for the I and Q coordinate values in a first quadrant in the (I,Q) array;

computing a (p−1)-tuple of values defined by $$r_{xi,p-1} = r_{x,i}/a(1) (x=I,Q),$$

$$r_{xi,p-k-1} = \{r_{xi,p-k} - (2 \cdot B_{1x,i} - 1) \cdot (a(k))\}/(a(k+1)) \ (k=1, \ldots, p-1),$$

$$r_{xi,0} = a(p-1)\{r_{b,1} - (2 \cdot B_{1x,i} - 1)\} \cdot a(p-1)/a(p),$$

$$a(k) = \{v1 + \ldots + v(2^{p-k})\}/2^{p-k} - a(k-1),$$

$a(0)=0$, $a(p)=(v1-v2)/2$, and determining a p-tuple of values $(B_{(p-1)x,i}, \ldots, B_{0x,i})$, each value equal to 0 or 1, representing the signal value $r_{x,i}$ in the $(2^{2p})$QAM configuration, according to a selected decoding process; and interpreting the p-tuple $(B_{(p-1)x,i}, \ldots, B_{0x,i})$ as a decoded sequence representing the numerical value $r_{x,i}$.

13. The method of claim 12, further comprising determining said values $B_{nx,i}$ (n=0, 1, . . . ,p−1) according to a procedure comprising:

when $r_{x,i} \geq 0$, computing $r^{\wedge}_{x,i}=vk$ for which $|r_{x,i}-vk'|=$ minimum value (k'=1, . . . ,$2^{p-1}$);

when $r_{x,i}<0$, computing $r^{\wedge}x,i=-vk$ for which $|r_{x,i}+vk'|=$ minimum value (k'=1, . . . $2^{p-1}$); and expressing $r^{\wedge}_{x,i}$ as a p-tuple $(B_{(p-1)x,i}, \ldots, B_{0x,i})$ representing said I coordinate (x=I) or said Q coordinate (x=Q) in said $(2^{2p})$QAM configuration.

14. The method of claim 12, further comprising determining said values $B_{nx,i}$ (n=0, 1, . . . , p−1) according to a maximum a posteriori probability procedure, using said signal values $r_{x,i}$.

15. The method of claim 12, wherein said signal values $r_{I,i}$ and $r_{Q,i}$ are provided by a procedure comprising:

expressing each of a sequence of signal values $r'_i$ (I=1, . . . , J) as a combination of a first p-tuple $(B'_{(p-1)I,i}, \ldots, B'_{1I,i}, B'_{0I,i})$ and a second p-tuple $(B'_{(p-1)Q,i}, \ldots, B'_{1Q,i}, B'_{0Q,i})$ of values;

embedding each value of the first p-tuple and of the second p-tuple for the sequence of signal values $r'_i$ in a multi-level block product code format;

modulating first and second multi-level block product codes containing the sequences of p-tuples $(B'_{(p-1)I,i}, \ldots, B'_{1I,i}, B'_{0I,i})$ and $(B'_{(p-1)Q,i}, \ldots, B'_{1Q,i}, B'_{0Q,i})$, respectively, as modulated sequences, and transmitting the modulated sequences; and receiving the modulated sequences as said signal values $r_{I,i}$ and $r_{Q,i}$.

* * * * *